United States Patent
McDonald et al.

(10) Patent No.: US 8,686,550 B2
(45) Date of Patent: Apr. 1, 2014

(54) METHOD AND APPARATUS FOR HIGH PRESSURE SENSOR DEVICE

(75) Inventors: William G. McDonald, Payson, AZ (US); Alexander M. Arayata, Gilbert, AZ (US); Philip H. Bowles, Fountain Hills, AZ (US); Stephen R. Hooper, Mesa, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 33 days.

(21) Appl. No.: 13/371,635

(22) Filed: Feb. 13, 2012

(65) Prior Publication Data

US 2013/0207207 A1    Aug. 15, 2013

(51) Int. Cl.
*H01L 23/02* (2006.01)

(52) U.S. Cl.
USPC ............ 257/686; 257/E21.499; 257/E21.502; 257/E21.505; 257/E23.003; 257/E23.02; 257/E23.052; 257/E23.068; 257/E23.124; 257/666; 257/782; 257/787; 438/51; 438/107; 438/109; 438/112; 438/123; 438/125; 438/127

(58) Field of Classification Search
USPC .................... 257/E21.499, E21.502, E21.505, 257/E23.003, E23.02, E23.052, E23.068, 257/E23.124, 666, 686, 782, 787; 438/51, 438/107, 109, 112, 123, 125, 127
See application file for complete search history.

(56) References Cited

U.S. PATENT DOCUMENTS

| | | | |
|---|---|---|---|
| 6,683,370 B1 | 1/2004 | McDonald et al. | |
| 6,929,977 B2 | 8/2005 | Takase et al. | |
| 2005/0146000 A1* | 7/2005 | Kim et al. | 257/670 |
| 2006/0220256 A1* | 10/2006 | Shim et al. | 257/777 |

\* cited by examiner

*Primary Examiner* — Asok K Sarkar
(74) *Attorney, Agent, or Firm* — Jonathan N. Geld

(57) ABSTRACT

A pressure sensor package is provided that reduces the occurrence of micro gaps between molding material and metal contacts that can store high-pressure air. The present invention provides this capability by reducing or eliminating interfaces between package molding material and metal contacts. In one embodiment, a control die is electrically coupled to a lead frame and then encapsulated in molding material, using a technique that forms a cavity over a portion of the control die. The cavity exposes contacts on the free surface of the control die that can be electrically coupled to a pressure sensor device using, for example, wire bonding techniques. In another embodiment, a region of a substrate can be encapsulated in molding material, using a technique that forms a cavity over a sub-portion of the substrate that includes contacts. A pressure sensor device can be electrically coupled to the exposed contacts.

8 Claims, 4 Drawing Sheets

METHOD AND APPARATUS FOR HIGH PRESSURE SENSOR DEVICE

BACKGROUND

1. Field

This disclosure relates generally to the field of pressure sensors, and more specifically, to cavity-style pressure sensing devices subject to rapid decompression events.

2. Related Art

Due to the significant influence tire pressure has on vehicle safety and efficiency, tire pressure monitoring systems have been mandated for light motor vehicles to help alert drivers to severe under inflation events. Two basic types of tire pressure monitoring systems (TPMS) have been adopted to satisfy this mandated requirement: direct and indirect systems. Direct TPMS employs pressure sensors on each tire to physically measure tire pressure and report that information to monitoring devices in the vehicle. Such systems can identify under-inflation situations, simultaneous or singly, in any combination. Such TPMS configurations can display real-time tire pressures that each location monitored, whether the vehicle is moving or standing still. Indirect TPMS does not use physical pressure sensors, but instead infers tire pressure by monitoring information such as individual wheel rotational speeds. Indirect TPMS operates under the presumption that an under-inflated tire's slightly smaller diameter results in a higher angular velocity for that tire. Additional signal processing techniques can be used for indirect TPMS to determine simultaneous under inflation and load shifting.

Typically, pressure sensors used in direct-sensor TPMS are installed inside the tires. Such internal sensors are typically either fitted to the wheel rim or two and in-tire section of the valve stem when the tire is fitted. Such sensors utilize radio frequency (RF) communication to transmit pressure readings and other data collected from the sensors.

The internal pressure sensors are typically semiconductor devices mounted in a cavity-style package. Typical cavity-style pressure sensing devices are placed in a pre-molded enclosure on a lead frame and the cavity is filled with silicone gel. But micro gaps can be present at interfaces between the plastic molding material and the metal contacts of the molded package. When such a TPMS device is exposed to high pressure (e.g., during tire inflation), high-pressure air can diffuse through the silicone gel and be stored in the micro gaps. If a rapid decompression event occurs, the air stored in the gaps can escape, resulting in bubbles forming within the silicone gel. The bubbles can interact with wirebond connections and microelectromechanical systems (MEMS) structures, which can cause errors in pressure readings or device failure. It is therefore desired to provide a pressure sensor package that does not have a tendency to develop micro gaps so that bubble formation can be avoided.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

A pressure sensor package is provided that reduces the occurrence of micro gaps that can store high-pressure air. Embodiments of the present invention provide this capability by reducing or eliminating interfaces between package molding material and metal contacts. In one embodiment, a control die is electrically coupled to a lead frame and then encapsulated in molding material, using a technique that forms a cavity over a portion of the control die. The cavity exposes contacts on the free surface of the control die that can be electrically coupled to a pressure sensor device using, for example, wire bonding techniques. In this embodiment, the cavity is formed such that the only exposed interface with the molding compound in the cavity is to the silicon of the control die. In another embodiment, a region of a substrate can be encapsulated in molding material, using a technique that forms a cavity over a sub-portion of the substrate that includes contacts. A pressure sensor device can be electrically coupled to the exposed contacts using, for example, wire bonding techniques. The contacts on the substrate can be coupled to an interlayer interconnect to provide coupling with a processor. In this embodiment, the cavity is formed such that the only exposed interface with the molding compound in the cavity is to the substrate material.

Typical prior art pressure sensor packages use a lead frame and a molded enclosure that forms a cavity. The type of metal that is used for the lead frame contacts has properties that make the contacts well-suited to wire bonding processes. For example, a typical lead frame is made of copper plated with nickel and gold, or nickel, palladium and gold. The use of gold in the plating material forms a relatively smooth surface on the lead frame. In addition, the plating material is not chemically active, and therefore doesn't tarnish like unprotected copper. But these features of smoothness and lack of chemical activity also contribute to poor adhesion of molding material with the surface of the plated lead frame. This poor adhesion leads to micro gaps that can trap high-pressure air during use of a pressure sensor installed in such a package.

Figure 1:
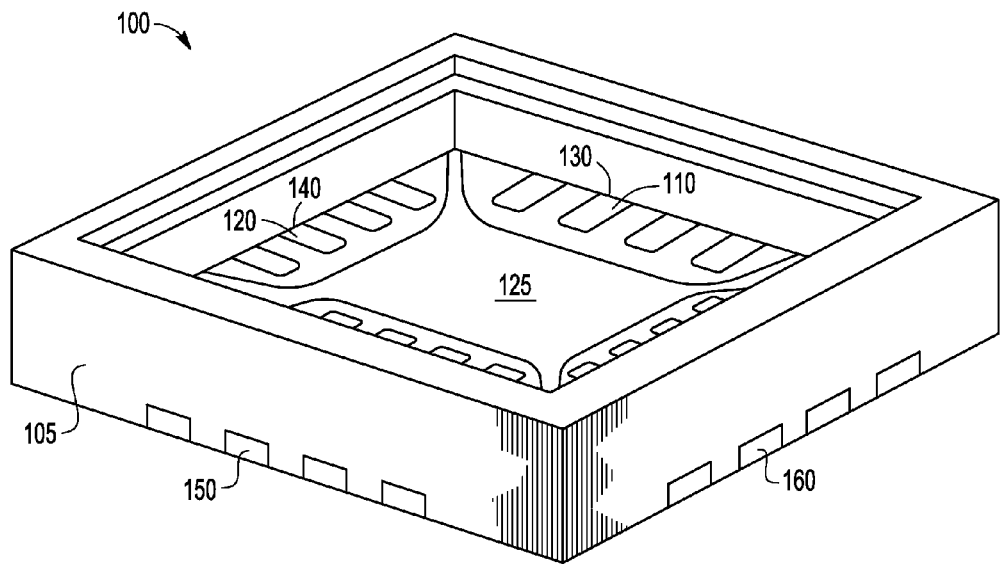
FIG. 1 is a simplified block diagram illustrating one example of a cavity-type package typical of the prior art.

FIG. 1 is a simplified block diagram illustrating one example of a cavity-type package typical of the prior art. Cavity package 100 provides a cavity formed by a molding compound 105. A lead frame is encapsulated by molding compound 105 that includes leads 110 and 120, and a device flag 125. As illustrated, leads 110 and 120 form interfaces 130 and 140, respectively, in the interior of the cavity of cavity package 100. A metal-molding compound interface is also formed along the perimeter of the leads and the perimeter of the flag with molding compound that forms part of the "floor" of the cavity. Lead frame leads are accessible along the perimeter of the outside of the package (e.g., leads 150 and 160). As illustrated, cavity package 100 is a cavity QFN package.

As discussed above, embodiments of the lead frame incorporating leads 110 and 120, and device flag 125, are copper plated with nickel and gold, or nickel, palladium and gold. Molding compound 105 can be any appropriate encapsulant including, for example, silica-filled epoxy molding compounds, plastic encapsulation resins, thermoplastic materials such as polyphenylene sulfide (PPS), and other polymeric materials.

Figure 2:
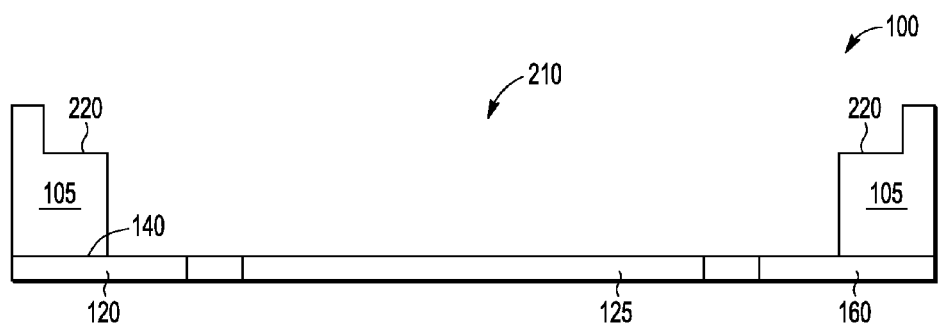
FIG. 2 is a simplified block diagram illustrating a cross section of cavity package 100.

FIG. 2 is a simplified block diagram illustrating a cross section of cavity package 100. Mold compound 105 is formed on a lead frame that includes leads 120 and 160, and device flag 125. As illustrated, interface 140 between lead 120 and mold compound 105 extends from the interior of cavity 210 along the length of lead 120. Mold compound 105 is formed in a manner to provide a ledge 220 that is configured to receive a gas permeable cap that can protect devices mounted in the interior of cavity 210.

Figure 3:
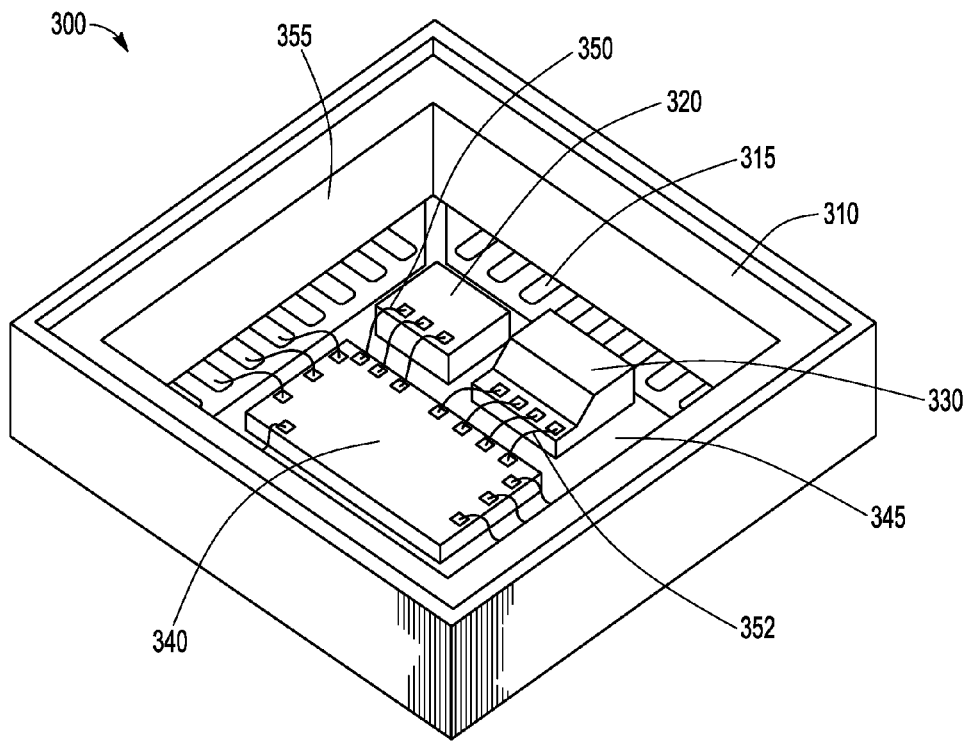
FIG. 3 is a simplified block diagram illustrating a cavity package incorporating device die, according to an example of the prior art.

FIG. 3 is a simplified block diagram illustrating a cavity package incorporating device die, according to an example of the prior art. Cavity package 300 includes cavity walls formed by package molding compound 310 and a cavity base formed by a lead frame including leads 315 and flag 345. Cavity package 300 is similar to cavity package 100 illustrated in FIG. 1. Mounted on flag 345 are devices, for example, pressure sensor 320, inertial sensor 330, and processor die 340. Each of the pressure sensor, inertial sensor, and processor die include electrical contacts available to be coupled with one of the other mounted devices or the lead frame leads. As illustrated, the electrical contacts are formed by wire bonds (e.g., 350, 352, and 355).

During operation of a pressure monitoring system, the cavity region of cavity package 300 is filled with a silicone gel and then capped with a pressure permeable cover to protect the gel and mounted devices. As discussed above, under high pressure, air in the cavity can be forced into micro gaps formed at the interface between leads 315 and mold compound (e.g., 310). During decompression, the trapped air can form air bubbles within the silicone gel.

In an effort to both reduce the size of pressure sensor devices and to reduce the amount of power consumed by the entire pressure monitoring system, pressure monitoring devices have transitioned using voltage-based signals between the sensors and the processor to using capacitive signals between the sensors and the processor. This results in fewer transistors in the sensor devices, which reduces both the size and the cost of the sensor devices (and therefore the entire system). The processor in such a system performs capacitance to voltage conversions, if any. A drawback of a capacitive signal-based system is that such a system is that capacitive signals are more sensitive to environmental changes. For example, formation of bubbles in the silicone gel (e.g., due to rapid decompression) can result in a parasitic capacitance that alters a signal received by processor die 340 from pressure sensor 320. In addition, bubbles can move the wires of the wire bonds. The wires are sensitive to movement and would therefore alter the physical layout of the system and subsequently the received data signals. This is a principle reason for the avoidance of bubble formation in the silicone gel.

Figure 4:
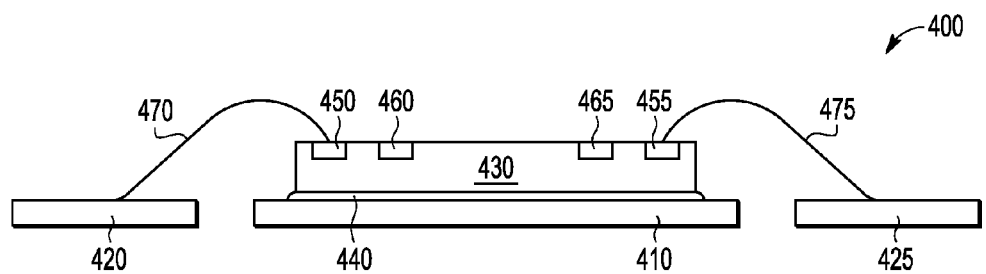
FIG. 4 is a simplified block diagram illustrating a cross-section of a system 400 at a stage in one example of processing, according to an embodiment of the present invention.

FIG. 4 is a simplified block diagram illustrating a cross-section of a system 400 at a stage in one example of processing, according to an embodiment of the present invention. A lead frame including a flag 410 and leads 420 is provided. In some embodiments, the lead frame is attached to a holder during processing steps (not shown). A control die 430 is attached to the flag 410 using an adhesive 440. Adhesive 440 can be of a standard type used in semiconductor packaging processing.

Control die 430 includes a number of bond pads 450, 455, 460 and 465 arranged on a major surface of the control die opposite to the control die major surface attached to flag 410. As illustrated, bond pads 450 and 455 are arranged toward the perimeter of the major surface of control die 430 and electrically coupled to leads 420 and 425, respectively, by wire bonds 470 and 475, respectively. Wire bonding is performed using methods and materials known in the art and appropriate to the application. Bond pads 460 and 465 are an example of bond pads arranged toward the interior of the major surface of control die 430, and will be electrically coupled to a pressure sensor using steps discussed below.

Figure 5:
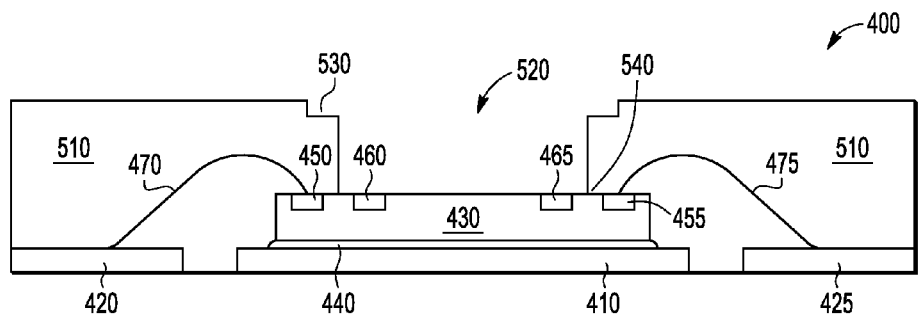
FIG. 5 is a simplified block diagram illustrating a cross section of system 400 at a subsequent stage in the example of processing, according to an embodiment of the present invention.

FIG. 5 is a simplified block diagram illustrating a cross section of system 400 at a subsequent stage in the example of processing, according to an embodiment of the present invention. A molding material is applied to the lead frame, control die and wire bonds illustrated in FIG. 4, forming an encapsulant 510 that encapsulates the structures within the molding material and forms a panel. The molding material is formed in a manner that produces a shaped cavity over a portion of control die 430, leaving bond pads 460 and 465 exposed but encapsulating bond pads 450 and 455 and the attached wire bonds. In one embodiment, the cavity includes a ledge region 530 configured to receive a pressure permeable cap. In other embodiments, a lid can be placed across the top of the cavity.

One method for forming the encapsulant such that the cavity is produced is a film-assisted mold technology known in the art. For example, the film-assisted molding can be performed by pressing a pin onto the top of the die with a flexible film between the pin and the mold compound. The mold compound will not flow to any location in which the pin is pressing down. In order to reduce the accuracy needed to form the cavity such that selected bond pads remain exposed, sufficient space should be provided between the region of encapsulated bond pads and exposed bond pads when forming control die 430.

As illustrated, interface region 540 between encapsulant 510 and the surface of control die 430 is not a metal-to-molding material interface. Instead, interface region 540 is a silicon-to-molding material interface. Tests have shown that the silicon-to-molding material interface is not subject to micro gaps, as generated by the metal-to-molding material interface. Thus, embodiments of the present invention avoid trapping high pressure air in the interface and consequently avoid formation of air bubbles in any gel used within cavity 520 due to this source in a finished device.

Figure 6:
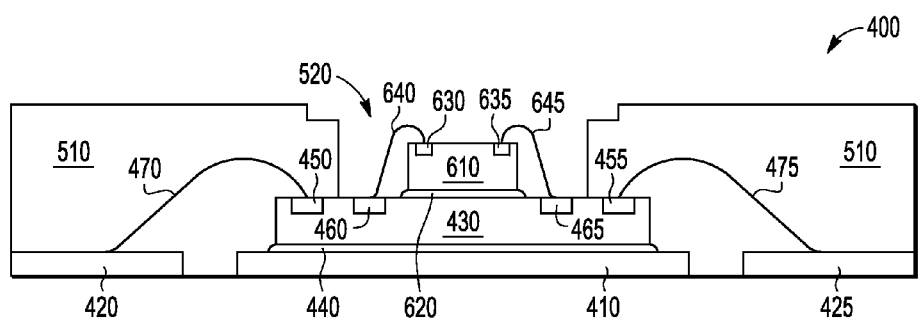
FIG. 6 is a simplified block diagram illustrating a cross-sectional system 400 at a subsequent stage in the example of processing, according to an embodiment of the present invention.

FIG. 6 is a simplified block diagram illustrating a cross-sectional system 400 at a subsequent stage in the example of processing, according to an embodiment of the present invention. A pressure sensor 610 is attached to the exposed surface of control die 430 using an adhesive 620. In one embodiment, a silicone adhesive is used. Pressure sensor 610 includes bond pads 630 and 635, which are coupled to control die bond pads 460 and 465, respectively, using wire bonds 640 and 645, respectively.

Once pressure sensor 610 is installed within cavity 520, the cavity can be filled with a gel suitable to the application (not shown), and then the cavity can be capped with a pressure permeable cap (not shown). The pressure sensing system packages can then be singulated in preparation for incorporating the pressure sensing system in a device suitable for the planned application.

An additional advantage of the devices embodying the present invention is that cavity 520 is typically smaller than the cavity present in cavity device 300, for example. Thus, significantly less gel material will be used to fill the cavity, thereby realizing additional savings in resources and money.

Figure 7:
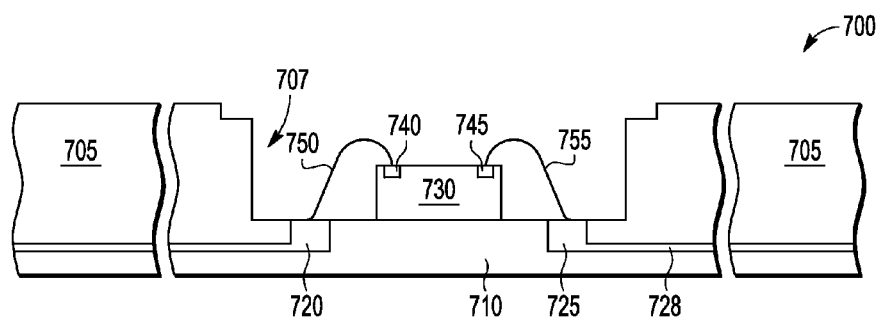
FIG. 7 is a simplified block diagram illustrating a cross section of a system 700, according to an alternative embodiment of the present invention.

FIG. 7 is a simplified block diagram illustrating a cross section of a system 700, according to an alternative embodiment of the present invention. System 700 includes a substrate 710 having electrical contacts 720 and 725 attached to an interlayer interconnect 728. Interconnect 728 is provided only by way of example, and it should be realized that the interconnects formed can extend not only across the page as illustrated but also into and above the page. Interconnect 728 is below the surface of substrate 710, except where contacts 720 and 725 are exposed.

A molding material is applied to substrate 710, forming an encapsulant 705 that encapsulates the substrate and any devices attached to the substrate, forming a panel. The molding material is formed in a manner that produces a shaped cavity 707 over a portion of substrate 710, leaving electrical contacts 720 and 725 exposed. As with the embodiment illustrated in FIG. 5, shaped cavity seven is seven includes a ledge region configured to receive a pressure permeable cap.

Pressure sensor 730 is installed within cavity 707 by attaching the pressure sensor to a portion of the exposed surface of substrate 710. Pressure sensor 730 includes bond pads 740 and 745, which are coupled to electrical contacts 720 and 725, respectively, by wire bonds 750 and 755, respectively. Again, once the pressure sensor is installed within the cavity, the cavity can be filled with a gel suitable to the application and the cavity is covered with a pressure permeable lid. Singulation can then be performed in a manner appropriate to the application, in preparation for including the pressure sensing systems in devices suitable for the application.

As discussed above, pressure sensor packages embodying the present invention are well-suited for high pressure that can also be subject to rapid decompression. Examples of applications suited to embodiments of the present invention include automotive tire pressure sensor monitors, automotive manifold absolute pressure sensors, automotive barometric absolute pressure sensors, medical devices, underwater applications, and the like.

Figure 8:
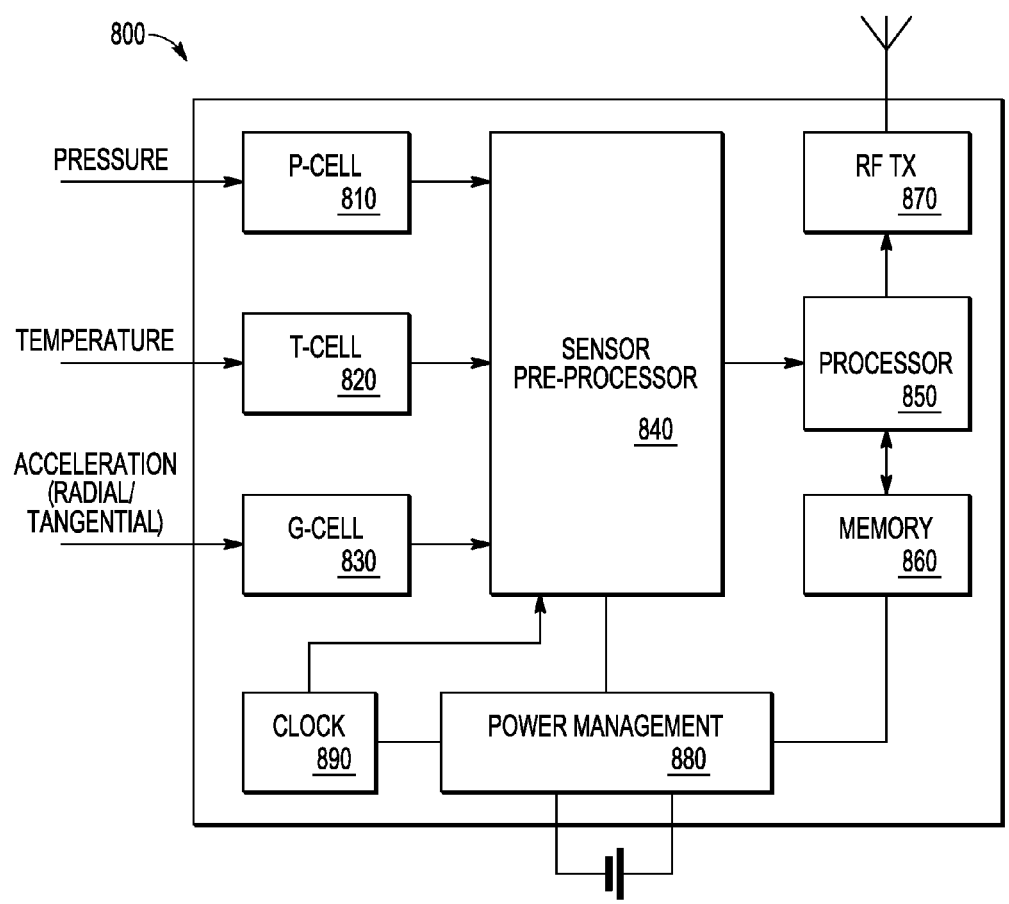
FIG. 8 is a simplified block diagram illustrating an example of a tire pressure monitoring system (TPMS), suitable for incorporating an embodiment of the present invention.

FIG. 8 is a simplified block diagram illustrating an example of a tire pressure monitoring system (TPMS), suitable for incorporating an embodiment of the present invention. TPMS 800 includes a pressure sensing P-cell 810, a temperature sensing T-cell 820, and an acceleration sensing G-cell 830. Each sensing cell is coupled to a sensor pre-processor 840 that performs initial processing tasks, such as capacitance-to-voltage conversion and analog-to-digital conversion of the signals received from the sensing cells. Each sensing cell can provide capacitive signals or voltage signals to the pre-processor.

Sensor pre-processor 840 provides one or more of the pre-processed signals and the signals received from the sensing cells to a processor 850 via a bus. Processor 850 can be a microcontroller unit of sufficient I/O and processing bandwidth to process signals from the sensing cells (e.g., in one embodiment processor 850 is an 8-bit MCU). Coupled to processor 850 is a memory 860 that can store, for example, values used during and after processing and firmware used by processor 850. Memory 850 can include RAM, ROM and/or flash memory.

TPMS 800 provides calculated sensor data to a central monitor on the vehicle by means of a radio-frequency transmitter 870 coupled to processor 850. Power is provided to the entire system by a power management module 880. Clocking for the system is provided by a clock module 890, which can provide a low frequency clock period (e.g., 1 msec).

A TPMS 800 can include separate or combined devices providing functionality of the various modules indicated in FIG. 8. For example, the functionality of pre-processor 840 and processor 850 can be combined in a single device die. Using embodiments of the present invention, P-cell 810 will be installed in a cavity formed over a portion of a major surface of a device providing functionality of pre-processor 840 (e.g., cavity 520). That major surface will include bond pads configured to receive the signals from P-cell 810. Other devices can be included in the cavity to the extent required by the application. Otherwise, the other modules illustrated in FIG. 8 will be encapsulated in a single molding or provided in multiple electrically coupled device modules.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

By now it should be appreciated that a method has been provided for forming a packaged semiconductor device assembly, wherein the method includes: providing a surface embodied within the package semiconductor device assembly where the surface includes a plurality of electrical contacts; forming an encapsulated region over a first portion of the surface, where a cavity region is formed over a second portion of the surface, a first subset of the plurality of electrical contacts is located on the second portion of the surface, and an interface between the encapsulant and the surface includes no electrical contacts along the entire border of the cavity region; affixing a first semiconductor device on a portion of the second portion of the surface; and, electrically coupling the first semiconductor device to one or more of the first subset of electrical contacts.

In one aspect of the above embodiment, the method further includes: providing a lead frame that includes a plurality of leads and a device flag; affixing a second semiconductor device to the device flag, where the second the semiconductor device includes first and second major surfaces, the first major surface is affixed to the device flag, and the second major surface includes the surface embodied within the package semiconductor device assembly; and, electrically coupling the second semiconductor device to one or more of the plurality of leads, where electrically coupling includes coupling one or more of a second subset of the plurality of electrical contacts to corresponding leads, and forming the encapsulated region includes encapsulating the lead frame, electrical contacts of the second semiconductor device coupled to the lead frame, and a portion of the second semiconductor device excluding the second portion of the surface. In a further aspect, the second semiconductor device is a control die, the first semiconductor devices a pressure sensor, and the control die is configured to process signals from the pressure sensor.

Another aspect of the above embodiment includes placing a silicone gel in the cavity region and over and surrounding the first semiconductor device, and placing a pressure permeable cap over the cavity region.

Still another aspect of the above embodiment includes providing a semiconductor device substrate, where the semiconductor device substrate includes the surface embodied within the package semiconductor device assembly at a first major surface and one or more interconnect layers between the first major surface and a second major surface of the substrate, and the one or more interconnect layers are electrically coupled with the first subset of the plurality of electrical contacts. A further aspect includes coupling a control die to a second plurality of electrical contacts coupled to the one or more interconnect layers, where the first semiconductor device is a pressure sensor, and the control die is configured to process signals from the pressure sensor. In still a further aspect, forming the encapsulated region further includes including the control die in the encapsulated region.

In another embodiment a high pressure sensor device package includes: a control die having a plurality of contacts on a first major surface of the control die; encapsulant formed over a portion of the control die, where the encapsulant defines a cavity region over a portion of the first major surface of the control die, the cavity region exposes a subset of the plurality of contacts, and an exposed interface between the encapsulant and the first major surface of control die includes none of the plurality of contacts; and, a semiconductor device affixed to the first major surface of control die in the cavity region and electrically coupled to one or more of the exposed subset of the plurality of contacts.

In one aspect of the above embodiment, the high pressure sensor device package further includes a lead frame comprising a plurality of leads and a device flag, where the control die is affixed to the device flag and a second major surface of the control die, the control die is electrically coupled to one or more of the plurality of leads, and encapsulant is further formed over the lead frame and the electrical coupling of the control die to the leads. In another aspect of the above embodiment, the high pressure sensor device package further includes a silicone gel in the cavity region and over and surrounding the semiconductor device, and a pressure permeable cap over the cavity region. In another aspect of the above embodiment, the high pressure sensor device package provides for the semiconductor device to be a pressure sensor. Aspects of the above embodiment can be included in an automobile tire pressure monitoring system, for example.

In another embodiment, a high pressure sensor device package is provided that includes: a semiconductor device substrate comprising a plurality of contacts on a first major surface of the semiconductor device substrate; encapsulant formed over a portion of the substrate, where the encapsulant defines a cavity region over a portion of the first major surface of the substrate, the cavity region exposes a subset of the plurality of contacts, and an exposed interface between the encapsulant and the first major surface of the substrate includes none of the plurality of contacts; and, a semiconductor device affixed to the first major surface of the substrate in the cavity region and electrically coupled to one or more of the exposed subset of the plurality of contacts.

In one aspect of the above embodiment, the semiconductor device is a pressure sensor. An automobile tire pressure monitoring system can include the high pressure sensor device package of the above aspect. In another aspect of the above embodiment, the substrate includes an interconnect layer electrically coupled to the subset of the plurality of contacts, and the interconnect layer is located on one of a second major surface of the substrate or within the substrate. In a further aspect, the high pressure sensor device package further includes a control die electrically coupled to the interconnect layer and configured to receive information from the semiconductor device. In still a further aspect, the control die is a processor configured to analyze information received from the semiconductor device.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Some of the above embodiments, as applicable, may be implemented using a variety of different information processing systems. For example, although FIG. 8 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for forming a packaged semiconductor device assembly, the method comprising:
   providing a lead frame comprising a plurality of leads and a device flag;
   affixing a semiconductor device die to the device flag, wherein the semiconductor device die comprises a first and second major surface, the first major surface is affixed to the device flag, and the second major surface provides a surface embodied within the packaged semiconductor device assembly, wherein the surface comprises a plurality of electrical contacts;
   forming an encapsulated region over a first portion of the surface using an encapsulant, wherein
      said forming the encapsulated region provides a cavity region over a second portion of the surface,
      a first subset of the plurality of electrical contacts is located on the second portion of the surface, and
      an interface between the encapsulant and the surface along an entire border of the cavity region comprises no electrical contacts;
   affixing a first semiconductor device on a portion of the second portion of the surface; and
   electrically coupling the first semiconductor device to one or more of the first subset of electrical contacts; and
   electrically coupling the semiconductor device die to one or more of the plurality of leads, wherein
      said electrically coupling comprises coupling one or more of a second subset of the plurality of the electrical contacts to corresponding leads, and
      said forming the encapsulated region comprises encapsulating the lead frame, electrical contacts of the semiconductor device die coupled to the lead frame, and a portion of the semiconductor device die excluding the second portion of the surface.

2. The method of claim 1 wherein
the semiconductor device die is a control die,
the first semiconductor device is a pressure sensor, and
the control die is configured to process signals from the pressure sensor.

3. The method of claim 1 further comprising:
placing a silicone gel in the cavity region and over and surrounding the first semiconductor device; and
placing a pressure permeable cap over the cavity region.

4. A high pressure sensor device package comprising:
a control die comprising a plurality of contacts on a first major surface of the control die;
encapsulant formed over a portion of the control die, wherein
   the encapsulant defines a cavity region over a portion of the first major surface of the control die,
   the cavity region exposes a subset of the plurality of contacts, and
   an exposed interface between the encapsulant and the first major surface of the control die comprises none of the plurality of contacts; and
a semiconductor device affixed to the first major surface of the control die in the cavity region and electrically coupled to one or more of the exposed subset of the plurality of contacts.

5. The high pressure sensor device package of claim 4 further comprising:
a lead frame comprising a plurality of leads and a device flag, wherein
   the control die is affixed to the device flag at a second major surface of the control die,
   the control die is electrically coupled to one or more of the plurality of leads, and
   the encapsulant is further formed over the lead frame and electrical coupling of the control die to the leads.

6. The high pressure sensor device package of claim 4 further comprising:
a silicone gel in the cavity region and over and surrounding the semiconductor device; and
a pressure permeable cap over the cavity region.

7. The high pressure sensor device package of claim 4 wherein the semiconductor device affixed to the first major surface of the control die is a pressure sensor.

8. An automobile tire pressure monitoring system comprising the high pressure sensor device package of claim 7.

* * * * *